(12) United States Patent
Ko et al.

(10) Patent No.: US 9,076,751 B2
(45) Date of Patent: Jul. 7, 2015

(54) SEMICONDUCTOR DEVICES WITH SELF-HEATING STRUCTURES, METHODS OF MANUFACTURE THEREOF, AND TESTING METHODS

(75) Inventors: Jia Yang Ko, Kaohsiung (TW); Ying-Han Chiou, Tainan (TW); Ling-Sung Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 774 days.

(21) Appl. No.: 13/221,594

(22) Filed: Aug. 30, 2011

(65) Prior Publication Data
US 2013/0049781 A1 Feb. 28, 2013

(51) Int. Cl.
*G01R 31/10* (2006.01)
*H01L 23/34* (2006.01)
*G01R 31/28* (2006.01)
*H01L 21/66* (2006.01)

(52) U.S. Cl.
CPC .......... *H01L 23/345* (2013.01); *G01R 31/2875* (2013.01); *G01R 31/2884* (2013.01); *H01L 22/34* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,787,799 B2 * | 9/2004 | Asam et al. | 257/48 |
| 2003/0101006 A1 * | 5/2003 | Mansky et al. | 702/30 |
| 2005/0211980 A1 * | 9/2005 | Fischer et al. | 257/48 |
| 2008/0206908 A1 * | 8/2008 | Walter | 438/18 |
| 2011/0042671 A1 | 2/2011 | Walter | |
| 2011/0102005 A1 * | 5/2011 | Feng et al. | 324/750.3 |

FOREIGN PATENT DOCUMENTS

CN 1714299 A 12/2005

\* cited by examiner

*Primary Examiner* — Melissa Koval
*Assistant Examiner* — Stephen G Armstrong
(74) *Attorney, Agent, or Firm* — Slater & Matsil, L.L.P.

(57) ABSTRACT

Semiconductor devices with self-heating structures, methods of manufacture thereof, and testing methods are disclosed. In one embodiment, a semiconductor device includes a workpiece, an active electrical structure disposed over the workpiece, and at least one self-heating structure disposed proximate the active electrical structure. The active electrical structure may include a capacitor, a resistor, a conductive line, a segment of a conductive line, a transistor, or a combination thereof.

16 Claims, 5 Drawing Sheets

SEMICONDUCTOR DEVICES WITH SELF-HEATING STRUCTURES, METHODS OF MANUFACTURE THEREOF, AND TESTING METHODS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Metal oxide semiconductor (MOS) devices often require wafer acceptance tests (WATs), some of which involve heating the MOS devices using external circuitry to test their operating parameters at elevated temperature, for life-time tests. Sometimes semiconductor wafers require WATs at high temperature for reliability life time tests, for example. This requires that the WAT team operator change the WAT probe card and raise the temperature to a higher temperature in the WAT tool, which is time-consuming. Furthermore, WATs have poor wafer per hour (WPH) throughput, particularly when high temperature WATs are necessary.

Thus, what are needed in the art are improved, less time-consuming methods of performing WATs on semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 7 illustrates a perspective view of an embodiment wherein a plurality of self-heating structures are formed in two metallization layers and an active electrical structure is formed in a metallization layer there between.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to the fabrication of semiconductor devices and to testing of semiconductor devices. Semiconductor devices having built-in on-chip self-heating structures, methods of fabrication thereof, and test methods using the novel self-heating structures will be described herein.

Figure 1:
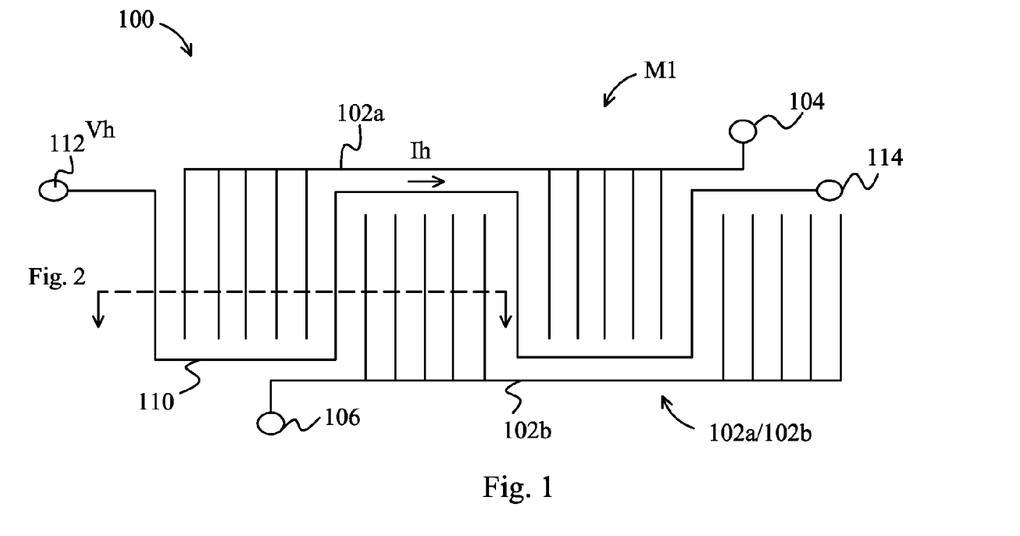
FIG. 1 shows a top view of an active electrical structure comprising a capacitor and a self-heating structure disposed proximate the active electrical structure within the same metallization layer in accordance with an embodiment of the present disclosure.

Referring first to FIG. 1, a top view of a semiconductor device 100 including an active electrical structure 102a/102b is shown. The term "active electrical structure" is used herein to describe a structure that has an active function in the semiconductor device 100 during normal operation and/or testing of the device 100, for example. The active electrical structure 102a/102b in the embodiment shown in FIGS. 1 and 2 comprises a capacitor. The capacitor comprises two capacitor plates 102a and 102b formed in a plurality of interconnected comb or finger structures. A self-heating structure 110 is disposed proximate the active electrical structure 102a/102b within the same metallization layer M1. The metallization layer M1 may comprise a metal layer formed in a back end of the line (BEOL) process, for example. The active electrical structure 102a/102b and self-heating structure 110 may alternatively be formed in other metallization layers M2, M3 . . . Mx of the semiconductor device 100, not shown in FIG. 1.

A first node 104 is coupled to one end of capacitive plate 102a, and a second node 106 is coupled to one end of capacitive plate 102b of the active electrical structure 102a/102b. A first node 112 is also coupled to an end of the self-heating structure 110, and a second node 114 is coupled to an opposite end of the self-heating structure 110, as shown. The nodes 104, 106, 112, and 114 may be coupled to or may comprise contacts on a surface of the semiconductor device 100 so they are electrically accessible for testing and applying voltage/current, for example. The self-heating structure 110 may be heated by applying a voltage $V_h$ to the nodes 112 and 114 of the self-heating structure 110, which causes a current $I_h$ to flow through the self-heating structure 110 and heats the self-heating structure 110. The voltage $V_h$ applied across the first node 112 and second node 114 generates heat in the self-heating structure 110 through the current $I_h$ flow. Because the self-heating structure 110 is proximate the active electrical structure 102a/102b, the active electrical structure 102a/102b is also heated, and tests may be performed on the active electrical structure 102a/102b using nodes 104 and 106 while the self-heating structure 110 is heated or while the self-heating structure 110 is allowed to cool after being heated. Advantageously, some tests that may be performed include wafer acceptance tests (WATs), so that external WATs are not required to be performed on the wafer the semiconductor device 100 resides on, (e.g., which require loading the wafers and long through-put time), saving time in the manufacturing process flow and thus providing a large cost savings.

Figure 2:
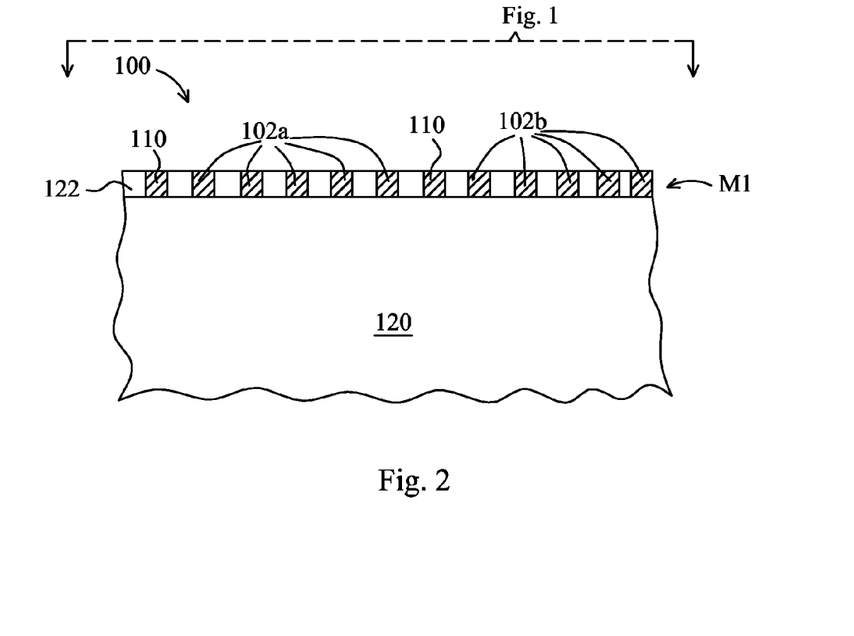
FIG. 2 shows a cross-sectional view of a portion of the semiconductor device shown in FIG. 1.

FIG. 2 shows a cross-sectional view of a portion of the semiconductor device 100 shown in FIG. 1. To manufacture the semiconductor device 100, a workpiece 120 is provided. The workpiece 120 may include a semiconductor substrate comprising silicon or other semiconductor materials and may be covered by an insulating layer, for example. The workpiece 120 may also include other active components or circuits, not shown. The workpiece 120 may comprise silicon oxide over single-crystal silicon, for example. The workpiece 120 may include other conductive layers or other semiconductor elements, e.g., transistors, diodes, etc. Compound semiconductors, GaAs, InP, Si/Ge, or SiC, as examples, may be used in place of silicon. The workpiece 120 may comprise a silicon-on-insulator (SOI) or a germanium-on-insulator (GOI) substrate, as examples. The workpiece 120 may comprise one or more layers of electrical circuitry and/or electronic functions formed thereon, and may include conductive lines, vias, capacitors, diodes, transistors, resistors, inductors, and/or other electrical components formed in a front end of the line (FEOL) process, for example (not shown).

The novel self-heating structure 110 of embodiments of the present disclosure may be formed in the BEOL in upper metallization layers of the semiconductor device 100. To form the metallization layer M1, for example, an insulating material 122 may be deposited and patterned with a pattern for the active electrical structure 102a/102b and the self-heating structure 110 using lithography. A conductive material comprising one or more metals is then deposited over the insulating material 122 to fill the patterns. The conductive material may comprise copper, copper alloys, or other metals, as examples. Excess conductive material is removed from over the insulating material 122 using one or more chemical-mechanical polish (CMP) processes and/or etch processes, forming the active electrical structure 102a/102b and self-heating structure 110, in a single damascene process, for example. The active electrical structure 102a/102b and self-heating structure 110 may also be formed using a subtractive etch process by depositing the conductive material and patterning the conductive material using lithography. Then the insulating material 122 is formed between the active electrical structure 102a/102b and self-heating structure 110. Alternatively, the active electrical structure 102a/102b and self-heating structure 110 may be formed over the workpiece 120 using other methods. Furthermore, while metallization layers are illustrated for forming the self-heating structures, one skilled in the art will recognize that other layers could be employed, including but not limited to forming self-heating structures in a polysilicon layer.

Only one self-heating structure 110 is shown proximate an active electrical structure 102a/102b in FIGS. 1 and 2; alternatively, two or more self-heating structures 110 may be formed proximate active electrical structures 102a/102b, to be described further herein.

The self-heating structures 110 of embodiments of the present disclosure may be included in semiconductor devices 100 proximate other types of active electrical structures 102, examples of which are shown in FIGS. 3 through 7. Like numerals are used for the various elements in FIGS. 3 through 7 that were used to describe FIGS. 1 and 2. To avoid repetition, each reference number shown in FIGS. 3 through 7 is not described again in detail herein. Rather, similar materials 100, 102, 104, etc., are used to describe the various material layers and components shown as were used to describe FIGS. 1 and 2.

Figure 3:
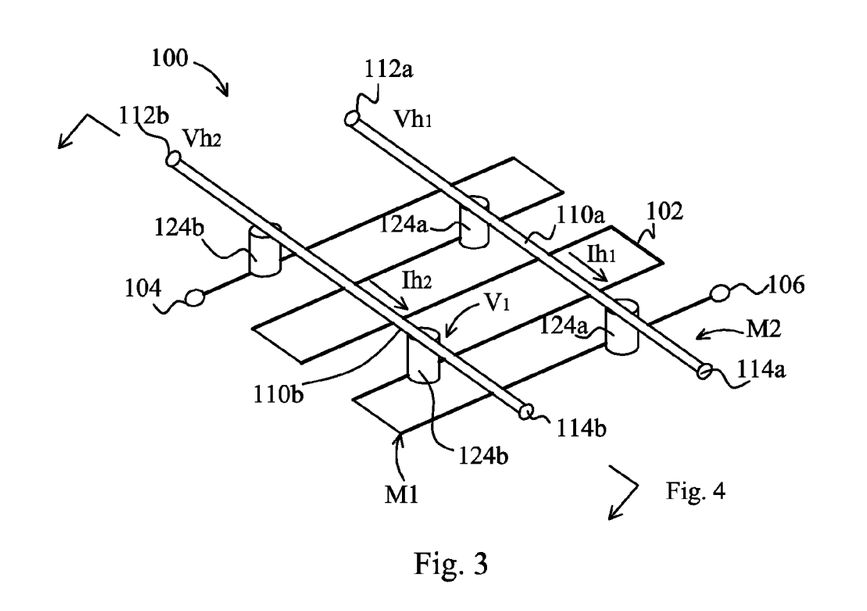
FIG. 3 illustrates a perspective view of an active electrical structure comprising electrical wiring or a resistor and a self-heating structure disposed proximate the active electrical structure in an adjacent metallization layer in accordance with another embodiment.
Figure 4:
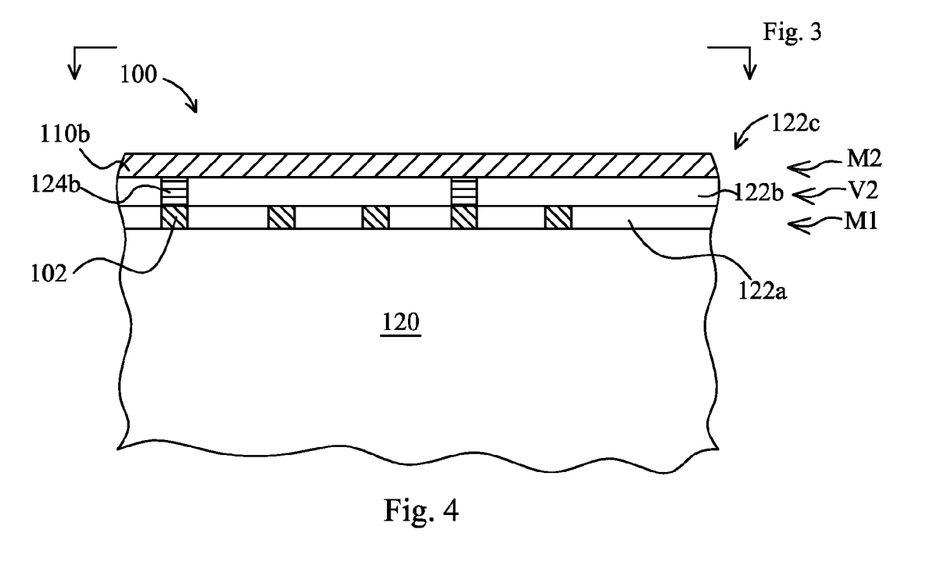
FIG. 4 shows a cross-sectional view of a portion of the semiconductor device shown in FIG. 3.

For example, FIG. 3 illustrates a perspective view of an active electrical structure 102 comprising electrical wiring or a resistor formed in a metallization layer M1 of a semiconductor device 100, and two self-heating structures 110a and 110b disposed proximate the active electrical structure 102 in an adjacent metallization layer M2. FIG. 4 shows a cross-sectional view of a portion of the semiconductor device 100 shown in FIG. 3. Only two self-heating structures 110a and 110b are shown in FIG. 3; however, a plurality, e.g., dozens or hundreds or more self-heating structures 110a and 110b may be formed in one or more metallization layers M1, M2, Mx of a semiconductor device 100 in accordance with embodiments of the present disclosure.

Portions of the self-heating structures 110a and 110b may be coupled to the active electrical structure 110 in some embodiments. For example, optional vias 124a and 124b may be used to electrically and thermally couple the self-heating structures 110a and 110b, respectively, to the underlying active electrical structure 102, as shown in FIGS. 3 and 4. The vias 124a and 124b facilitate in transferring the heat to the active electrical structure 102 for testing. The vias 124a and 124b may be formed using a single damascene process or a dual damascene process, as examples. Metallization layer M1 includes the active electrical structure 102 formed within insulating material 122a. Via layer V1 includes vias 124a and 124b formed within insulating material 122b, and metallization layer M2 includes self-heating structures 110a and 110b formed within an insulating material 122c (not visible in the figures).

In a dual damascene process to form the vias 124a and 124b and self-heating structures 110a and 110b, after the active electrical structure 102 and the insulating material 122a are formed in metallization layer M1, an insulating material 122b is deposited over the insulating material 122a and the active electrical structure 102. An optional etch stop layer, not shown, may be formed over the insulating material 122b, and an insulating material 122c is formed over insulating material 122b. Insulating material 122b and insulating material 122c are patterned simultaneously (or in two separate patterning steps) with a pattern for vias 124a and 124b in metallization layer V1 and with a pattern for self-heating structures 110a and 110b in metallization layer M2. The two patterned insulating materials 122b and 122c are then filled with a conductive material, forming vias 124a and 124b in metallization layer V1 and forming self-heating structures 110a and 110b in metallization layer M2. Excess conductive material is removed from over the insulating material 122c using one or more CMP processes and/or etch processes. Alternatively, the three metallization layers M1, V1 and M2 may also be formed using three single damascene processes, three single subtractive etch processes, or other methods.

The self-heating structures 110a and 110b may be heated by applying a voltage $V_{h1}$ and $V_{h2}$ across nodes 112a and 114a and 112b and 114b, respectively. The heat is transferred to the active electrical structure 102, e.g., through the insulating material layer 122b and also through vias 124a and 124b, if included in the structure. The voltage $V_{h1}$ and $V_{h2}$ may be continuously applied to the self-heating structures 110a and 110b while performing electrical tests on the active electrical structure 102, in some embodiments, maintaining the heating of the self-heating structures 110a and 110b and also the active electrical structure 102 during the testing process.

If the vias 124a and 124b are included in the semiconductor device 100, then in some embodiments, the self-heating structures 110a and 110b are heated for a predetermined period of time to achieve a desired temperature, and then the voltages $V_{h1}$ and $V_{h2}$ are removed or disconnected from nodes 112a and 114a, and 112b and 114b of the self-heating structures 110a and 110b. Then, electrical tests such as WATs are performed on the active electrical structure 102, e.g., using nodes 104 and 106. Removing the voltages $V_{h1}$ and $V_{h2}$ from the self-heating structures 110a and 110b may reduce or prevent interference of the voltages $V_{h1}$ and $V_{h2}$ and currents $I_{h1}$ and $I_{h2}$ with the electrical tests, for example.

Figure 5:
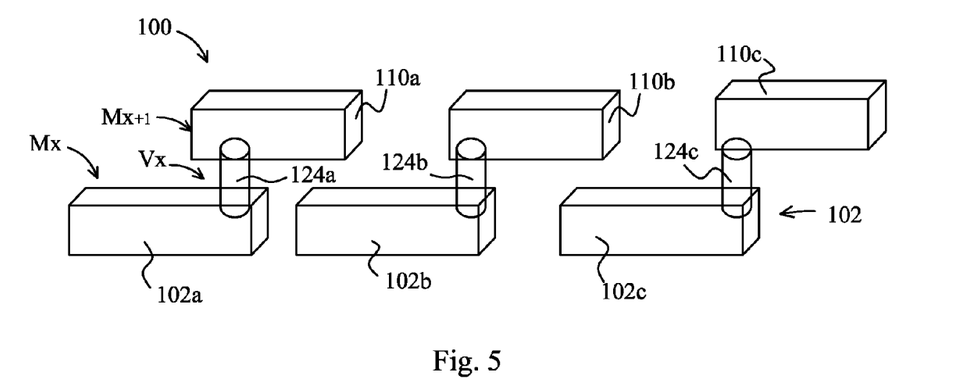
FIG. 5 shows a perspective view of another embodiment wherein the active electrical structure and the self-heating structure are formed in adjacent metallization layers.

FIG. 5 shows a perspective view of another embodiment wherein the active electrical structures 102a, 102b, and 102c and self-heating structures 110a, 110b, and 110c are formed in adjacent metallization layers Mx and Mx+1. The active electrical structure 102 includes three active electrical structures 102a, 102b, and 102c that comprise conductive line segments in this embodiment. Three self-heating structures 110a, 110b, and 110c are coupled by vias 124a, 124b, and 124c to the active electrical structures 102a, 102b, and 102c, respectively. Nodes (not shown in FIG. 5; see FIGS. 1 and 3) may be used to apply a voltage $V_h$ to the self-heating structures 110a, 110b, and 110c and generate heat in the active electrical structures 102a, 102b, and 102c. As in the other embodiments, the active electrical structures 102a, 102b, and 102c and self-heating structures 110a, 110b, and 110c are formed in metallization layers Mx and Mx+1 that are adjacent metallization layers in the semiconductor device 100, separated by via layer Vx in which the optional vias 124a, 124b, and 124c are formed in.

The metallization layers Mx and Mx+1 may comprise any metallization layer in the semiconductor device 100 for this embodiment and also in the other embodiments described herein, for example. Although the illustrated embodiments show the self-heating structure(s) being formed in adjacent metallization layers, in other contemplated embodiments, the self-heating structure(s) could be formed in metallization layers that are removed by one or more layers from the active electrical structure(s), provided the self-heating structure(s) are close enough to allow for efficient heat transfer from the self-heating structure(s) to the active electrical structure(s) through the intervening layer or layers.

Figure 6:
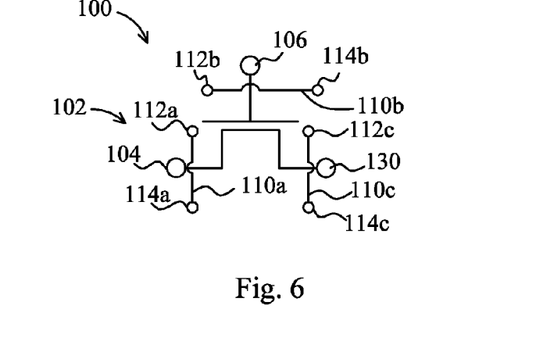
FIG. 6 shows a schematic diagram of an active electrical structure comprising a MOS transistor having self-heating structures proximate various terminals of the transistor in accordance with another embodiment.

FIG. 6 shows a schematic diagram of an active electrical structure 102 comprising a MOS transistor having self-heating structures 110a, 110b, and 110c proximate various terminals or nodes 104, 106 and 130 of the transistor. The self-heating structures 110a, 110b, and 110c may be formed in an adjacent metallization layer to a metallization layer that a portion of the MOS transistor comprising the active electrical structure 102 is formed in, in this embodiment.

Figure 7:
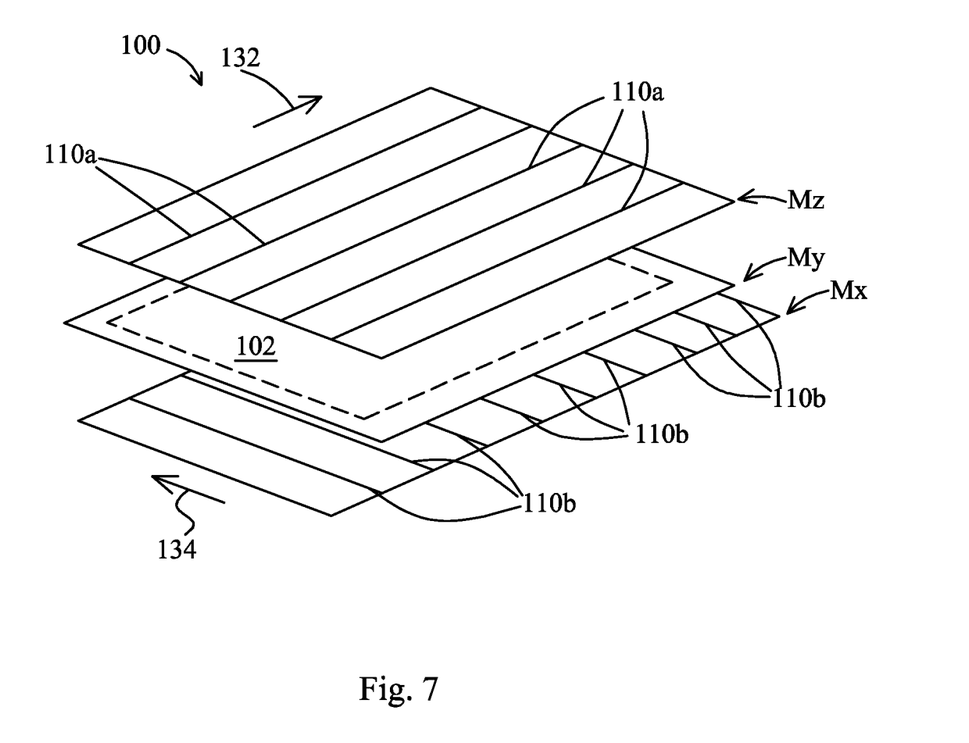

FIG. 7 illustrates a perspective view of an embodiment wherein a plurality of first self-heating structures 110a and a plurality of second self-heating structures 110b are formed in two metallization layers Mz and Mx, respectively. An active electrical structure 102 is formed in a metallization layer My disposed between metallization layers Mz and Mx. The plurality of first self-heating structures 110a is oriented in a first direction 132 (e.g., lengthwise), and the plurality of second self-heating structures 110b is oriented in a second direction 134. The second direction 134 is different than the first direction 132 in the embodiment shown. For example, the second direction 134 may be substantially perpendicular to the first direction 132. In other embodiments, the second direction 134 may be substantially the same as the first direction 132 (not shown). The structure shown in FIG. 7 advantageously provides even heating of the active electrical structure 102, by providing even heating in parallel lines of self-heating structures 110a and 110b both above and below the active electrical structure 102, for example.

The novel self-heating structures 110, 110a, 110b, and 110c described herein may comprise conductive metal lines having a substantially straight line shape, as shown in FIGS. 3 through 7. The self-heating structures 110, 110a, 110b, and 110c may also comprise conductive metal lines having a serpentine shape, as shown in FIG. 1. Alternatively, the self-heating structures 110, 110a, 110b, and 110c may comprise other shapes and configurations.

Figure 8:
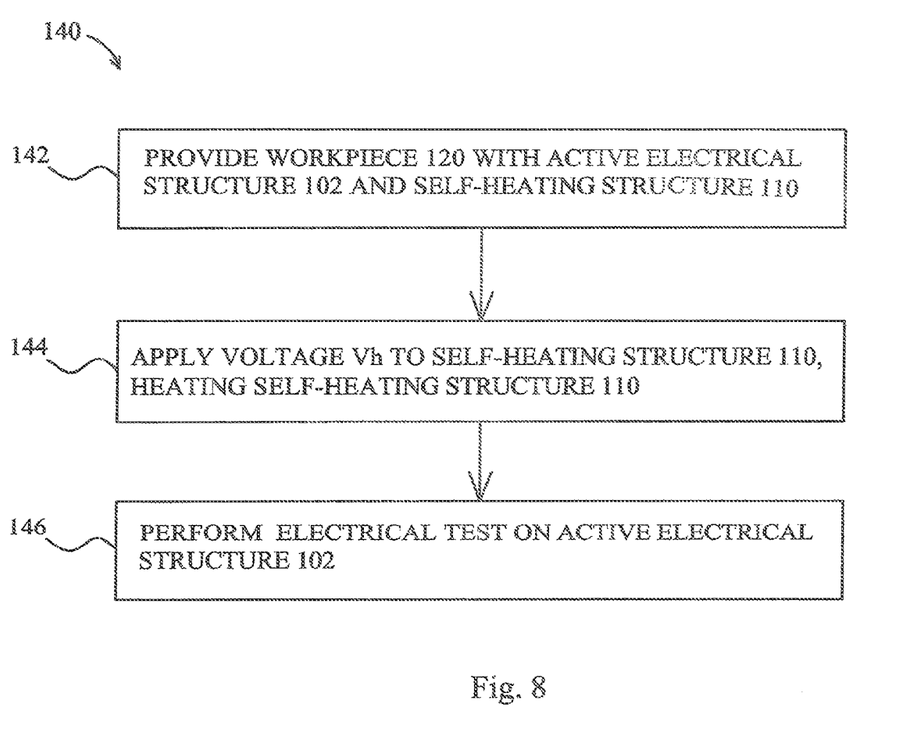
FIG. 8 is a flow chart showing a method of testing a semiconductor device utilizing the novel self-heating structures of embodiments of the present disclosure.

FIG. 8 is a flow chart 140 showing a method of testing a semiconductor device 100 utilizing the novel self-heating structures 110, 110a, 110b, and 110c of embodiments of the present disclosure. First, a workpiece 120 is provided that includes at least one active electrical structure 102 and at least one self-heating structure 110 (step 142). A voltage $V_h$ is applied to at least one of the self-heating structures 110 (step 144), heating the at least one of the self-heating structure 110. An electrical test (or tests) is then performed on the active electrical structure 102 (step 146).

The amount of voltage $V_h$, $V_{h1}$, and $V_{h2}$ applied to the nodes 112, 112a, 112b, 112c, 114, 114a, 114b, and 114c of the self-heating structures 110, 110a, 110b, or 110c may comprise about 1 Volt in some embodiments. Alternatively, the amount of voltage $V_h$, $V_{h1}$, and $V_{h2}$ applied may comprise other values, depending on the application and the semiconductor device 100, such as about 15 Volts or less in some embodiments.

In some embodiments, a current $I_h$, $I_{h1}$, $I_{h2}$ may be measured through the self-heating structures 110, 110a, 110b, or 110c, and an amount of heat generated proximate the active electrical structures 102, 102a, or 102b may be determined from the amount of current $I_h$, $I_{h1}$, $I_{h2}$ measured through the self-heating structures 110, 110a, 110b, or 110c. The amount of heat generated may be determined using Eq. 1:

$$R=V_h/I_h; \qquad \text{Eq. 1:}$$

wherein $V_h$ is the voltage applied to the self-heating structure 110, 110a, 110b, or 110c, R is the resistance of the self-heating structure 110, 110a, 110b, or 110c, and $I_h$ is the current measured through the self-heating structure 110, 110a, 110b, or 110c. A change in the resistance R is indicative of a temperature of the self-heating structure 110, 110a, 110b, or 110c. The change ΔR in the resistance value R from a room temperature measurement indicates the temperature of the self-heating structure 110, 110a, 110b, or 110c and surrounding structures such as the active electrical structures 102, 102a, or 102b, for example.

Advantages of embodiments of the disclosure include eliminating or reducing the need for WATs on semiconductor devices 100 and wafers in a laboratory, clean-room setting, or test facility, by performing WATs in the manufacturing site or probe area. High temperature WAT for reliability lifetime tests may be performed, e.g., at temperatures of around 125 degrees C. without changing a WAT probe card or raising the temperature in a WAT tool. The novel self-heating structures 110, 110a, 110b, and 110c are also useful in lower temperature environments and normal temperature environments, e.g., at temperatures of around 25 degrees C. Furthermore, wafer per hour (WPH) statistics are increased, resulting in improved and higher throughput. The novel testing methods and semiconductor device 100 manufacturing methods described herein are easily implemented in existing testing and manufacturing process flows.

Embodiments of the present disclosure include semiconductor devices 100 having the novel self-heating structures 110, 110a, 110b, and 110c included therein, and methods of manufacturing thereof. Embodiments also include methods of testing semiconductors devices 100 using the novel self-heating structures 110, 110a, 110b, and 110c described herein.

In one embodiment, a semiconductor device includes a workpiece, an active electrical structure disposed over the workpiece, and at least one self-heating structure disposed proximate the active electrical structure.

In another embodiment, a method of manufacturing a semiconductor device includes providing a workpiece, and forming at least one active electrical structure over the workpiece. At least one self-heating structure is formed proximate the at least one active electrical structure.

In yet another embodiment, a method of testing a semiconductor device includes providing a workpiece, a metallization layer being disposed over the workpiece and the workpiece having an active electrical structure formed therein. The workpiece includes at least one self-heating structure disposed proximate the active electrical structure. The method of testing includes applying a voltage to the at least one self-heating structure, heating the at least one self-heating structure, and performing at least one electrical test on the active electrical structure.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a workpiece;
   an active electrical structure disposed over the workpiece, wherein the active electrical structure is selected from a group consisting of a capacitor, a resistor, a transistor, or a combination thereof; and
   at least one self-heating structure disposed proximate the active electrical structure, the at least one self-heating structure comprising a first self-heating structure and a second self-heating structure, wherein the active electrical structure is interposed between the first self-heating structure and the second self-heating structure in a plane substantially orthogonal to a major surface of the workpiece.

2. The semiconductor device according to claim 1, wherein the active electrical structure is disposed in a first metallization layer, and wherein the at least one self-heating structure is disposed in a second metallization layer.

3. The semiconductor device according to claim 2, wherein the second metallization layer is adjacent the first metallization layer.

4. The semiconductor device according to claim 3, wherein portions of the at least one self-heating structure are coupled to the active electrical structure.

5. The semiconductor device according to claim 4, wherein the portions of the at least one self-heating structure coupled to the active electrical structure comprise vias in a via layer disposed between the first metallization layer and the second metallization layer.

6. The semiconductor device according to claim 1, further comprising a first node coupled to a first end of the at least one self-heating structure and a second node coupled to a second end of the at least one self-heating structure, wherein a voltage applied across the first node and second node generates heat in the at least one self-heating structure.

7. A method of manufacturing a semiconductor device, the method comprising:
   providing a workpiece;
   forming at least one active electrical structure over the workpiece, wherein forming the at least one active electrical structure comprises forming a capacitor, a resistor, a transistor, or a combination thereof; and
   forming at least one self-heating structure proximate the at least one active electrical structure, the forming the at least one self-heating structure comprising:
      forming a plurality of first self-heating structures oriented in a first direction in a first metallization layer, each of the first plurality of self-heating structures having a first end and a second end, the first ends being aligned in a first plane and the second ends being aligned in a second plane, the second plane being different than the first plane, the first plurality of self-heating structures comprising more than two self-heating structures; and
      forming a plurality of second self-heating structures oriented in a second direction in a second metallization layer, each of the second plurality of self-heating structures having a third end and a fourth end, the third ends being aligned in a third plane and the fourth ends being aligned in a fourth plane, the fourth plane being different than the third plane, the second plurality of self-heating structures comprising more than two self-heating structures, the second direction being different than the first direction.

8. The method according to claim 7, wherein forming the at least one self-heating structure comprises forming wiring having a substantially straight line shape or a serpentine shape.

9. The method according to claim 7, wherein forming the at least one active electrical structure comprises forming the at least one active electrical structure in a third metallization layer, and wherein the third metallization layer is disposed between the first metallization layer and the second metallization layer.

10. A method of testing a semiconductor device, the method comprising:
   providing a workpiece, a metallization layer being disposed over the workpiece and the workpiece having an active electrical structure formed therein, wherein the active electrical structure is selected from a group consisting of a capacitor, a resistor, a transistor, or a combination thereof, the workpiece further comprising at least one self-heating structure disposed proximate the active electrical structure, the at least one self-heating structure comprising a first self-heating structure and a second self-heating structure, wherein the metallization layer is interposed between the first self-heating structure and the second self-heating structure in a plane substantially orthogonal to a major surface of the workpiece;
   applying a voltage to the at least one self-heating structure, heating the at least one self-heating structure; and
   performing at least one electrical test on the active electrical structure.

11. The method according to claim 10, further comprising measuring a current through the at least one self-heating structure, and determining an amount of heat generated proximate the active electrical structure from the amount of current measured through the at least one self-heating structure.

12. The method according to claim 11, wherein determining the amount of heat generated is determinable using Eq. 1:

$$R = V_h/I_h; \qquad \text{Eq. 1:}$$

wherein $V_h$ is the voltage applied to the at least one self-heating structure, R is the resistance of the at least one self-heating structure, and $I_h$ is the current measured through the at least one self-heating structure, wherein a change in the resistance R is indicative of a temperature of the at least one self-heating structure.

13. The method according to claim 10, wherein performing the at least one electrical test comprises performing at least one wafer acceptance test (WAT).

14. The method according to claim 10, further comprising continuously applying the voltage to the at least one self-heating structure while performing the at least one electrical test on the active electrical structure.

15. The method according to claim 10, further comprising discontinuing applying the voltage to the at least one self-heating structure while performing the at least one electrical test on the active electrical structure.

16. The method according to claim 10, wherein applying the voltage comprises applying about 15 Volts or less.

* * * * *